(12) United States Patent
Moon

(10) Patent No.: US 9,415,695 B2
(45) Date of Patent: Aug. 16, 2016

(54) ELECTRIC VEHICLE CHARGER

(71) Applicant: LSIS CO., LTD., Anyang-si, Gyeonggi-do (KR)

(72) Inventor: Ki Young Moon, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 589 days.

(21) Appl. No.: 13/904,451

(22) Filed: May 29, 2013

(65) Prior Publication Data

US 2014/0062399 A1 Mar. 6, 2014

(30) Foreign Application Priority Data

Sep. 5, 2012 (KR) .................... 20-2012-0007919 U

(51) Int. Cl.
*H02J 7/00* (2006.01)
*B60L 11/18* (2006.01)
(Continued)

(52) U.S. Cl.
CPC ............... *B60L 11/1816* (2013.01); *B60L 1/00* (2013.01); *B60L 3/0069* (2013.01); *B60L 3/04* (2013.01); *B60L 11/1824* (2013.01); *B60L 11/1846* (2013.01); *B60L 2230/12* (2013.01); *B60L 2230/16* (2013.01); *B60L 2240/547* (2013.01); *B60L 2240/549* (2013.01); *Y02T 10/7005* (2013.01); *Y02T 10/7088* (2013.01); *Y02T 90/121* (2013.01); *Y02T 90/128* (2013.01);
(Continued)

(58) Field of Classification Search
USPC ........................................................ 320/109
See application file for complete search history.

(56) References Cited

U.S. PATENT DOCUMENTS 5,969,624 A * 10/1999 Sakai ....................... B60K 6/46
180/65.245
6,624,529 B2 * 9/2003 Obayashi ................... H02J 1/14
290/40 B
(Continued)

FOREIGN PATENT DOCUMENTS

CN 101073191 11/2007
CN 102386650 3/2012
(Continued)

OTHER PUBLICATIONS

Korean Intellectual Property Office Application Serial No. 20-2012-0007919, Office Action dated Sep. 5, 2014, 2 pages.
(Continued)

*Primary Examiner* — Yalkew Fantu
(74) *Attorney, Agent, or Firm* — Lee, Hong, Degerman, Kang & Waimey PC; Jonathan Kang; Justin Lee

(57) ABSTRACT

An electric vehicle charger includes a case including a lower case having an opened top surface and in which a connector insertion groove is defined in a side surface thereof and an upper case having an opened bottom surface and covering the opened top surface of the lower case, a circuit board seated on the lower case and on which at least one electrical component of a short-circuit detection part detecting short-circuit of an electric vehicle, a detection part detecting overvoltage and overcurrent during charging of the electric vehicle, a communication module communicating with a charging control part of the electric vehicle, and a display part displaying a charged state of the electric vehicle is mounted, a cable inserted into the lower case, the cable being electrically connected to the circuit board, and a cable connector inserted into the connector insertion groove to guide the insertion of the cable.

7 Claims, 8 Drawing Sheets

(51) Int. Cl.
  *B60L 1/00* (2006.01)
  *B60L 3/00* (2006.01)
  *B60L 3/04* (2006.01)

(52) U.S. Cl.
  CPC . *Y02T90/14* (2013.01); *Y02T 90/16* (2013.01); *Y02T 90/163* (2013.01); *Y02T 90/169* (2013.01); *Y04S 30/14* (2013.01)

(56) References Cited

U.S. PATENT DOCUMENTS

| | | | |
|---|---|---|---|
| 2010/0076615 A1* | 3/2010 | Daniel | F03D 9/00 700/293 |
| 2010/0174667 A1* | 7/2010 | Vitale | B60L 30/0069 705/412 |
| 2010/0217475 A1* | 8/2010 | Menze | B60R 16/03 701/31.4 |
| 2011/0169447 A1* | 7/2011 | Brown | B60L 3/0069 320/109 |

FOREIGN PATENT DOCUMENTS

| | | |
|---|---|---|
| JP | 53-84098 | 7/1978 |
| JP | 53-113399 | 9/1978 |
| JP | 60-150842 | 10/1985 |
| JP | 1-63179 | 4/1989 |
| JP | 05-007086 | 1/1993 |
| JP | 2002-216890 | 8/2002 |
| JP | 2008-227464 | 9/2008 |
| KR | 20-1996-0027750 | 8/1996 |
| KR | 10-2005-0062007 | 6/2005 |
| KR | 10-2011-0052773 | 5/2011 |
| WO | 2011/127746 | 10/2011 |

OTHER PUBLICATIONS

Japan Patent Office Application Serial No. 2013-112576, Office Action dated Feb. 25, 2014, 3 pages.
The State Intellectual Property Office of the People's Republic of China Application Serial No. 201310252904.9, Office Action dated Apr. 15, 2015, 8 pages.
Korean Intellectual Property Office Application Serial No. 20-2012-0007919, Office Action dated Dec. 7, 2013, 5 pages.

* cited by examiner

ELECTRIC VEHICLE CHARGER

CROSS-REFERENCE TO RELATED APPLICATIONS

Pursuant to 35 U.S.C. §119(a), this application claims the benefit of earlier filing date and right of priority to Korean Patent Application No. 20-2012-0007919, filed on Sep. 5, 2012, the contents of which are hereby incorporated by reference in their entirety.

BACKGROUND

The present disclosure relates to a charging apparatus for electric vehicles.

In recent, technologies with respect to electric vehicles driven by using electricity that is green energy are being rapidly developed. Most of electric vehicles include a motor generating rotation force, a battery supplying power into the motor, an inverter controlling an RPM of the motor, a battery charger charging the battery from electricity, and a low voltage DC/DC converter for electric vehicles.

Methods for charging electric vehicles may be classified into a rapid charging method and a slow charging method. The rapid charging method may be a method in which high pressure current is converted into DC current in a high-speed charger to directly charge batteries for electric vehicles. Thus, it may take a short time to charge the batteries. The slow charging method may be a method in which an on board charger is provided to convert AC current applied from the outside into DC current, thereby charging batteries for electric vehicles. In case of the slow charging method, it may take a long time to charge batteries, but the batteries may be charged in many households.

A charger that is one of electric vehicle supply equipment may be provided as a stand type charger in charging stations. Alternatively, the charger may be provided as a charger that can directly charge batteries in households by a driver.

FIG. 1 is a perspective view illustrating a structure of a control box of a home charger, and FIG. 2 is a cross-sectional view illustrating a connection structure between the control box and a cable.

Referring to FIG. 1, a control box 1 of a home charger includes an upper case (not shown) and a lower case 2. A circuit board (not shown) on which electrical components are mounted is mounted within the control box 1. Also, a cable 3 surrounding a wire 3a including an electric wire and signal wire for charging is connected to the circuit board.

In detail, the cable 3 is inserted into the control box 1 from the outside. For this, a cable through hole 2a is defined in a side of the control box 1. Also, a waterproof packing 4 is disposed between the cable 3 and the cable through hole 2a to prevent foreign substances from being introduced through a gap generated between the cable 3 and the cable through hole 2a. Particularly, the waterproof packing 4 is mounted on the cable through hole 2a, and the cable 3 passes through the waterproof packing 4 and then is inserted into the control box 1.

Here, for the waterproofing, it may be designed so that an edge of the cable through hole 2a is sized and shaped to be tighten with a sealing groove of the waterproof packing 4. As a result, it may be very difficult to fit the waterproof packing into the cable through hole 2a. In addition, the cable 3 passes through the cable through hole 2a, and then the waterproof packing 4 is fitted into an outer circumferential surface of the cable 3. Then, the waterproof packing 4 fitted into the cable 3 is coupled to the cable through hole 2a. Also, it may be designed so that an inner diameter of the cable through hole 2a has substantially the same size as an outer diameter of the sealing groove defined in the outer circumferential surface of the cable 3. Thus, when a metal ring formed of a metallic material is disposed on ends of the wires surrounded by the cable 3 (see the drawings), it may be very difficult to allow the cable 3 on which the metal ring is disposed to pass through the cable through hole 2a, thereby inserting the cable 3 into the control box 1.

SUMMARY

Embodiments provide an electric vehicle charger which is capable of achieving easy of an assembly process and waterproof performance at the same time by improving an assembly structure of a home charger in which a cable is inserted into a control box.

In one embodiment, an electric vehicle charger includes: a case including a lower case having an opened top surface and in which a connector insertion groove is defined in a side surface thereof and an upper case having an opened bottom surface and covering the opened top surface of the lower case; a circuit board seated on the lower case and on which at least one electrical component of a short-circuit detection part detecting short-circuit of an electric vehicle, a detection part detecting overvoltage and overcurrent during charging of the electric vehicle, a communication module communicating with a charging control part of the electric vehicle, and a display part displaying a charged state of the electric vehicle is mounted; a cable inserted into the lower case, the cable being electrically connected to the circuit board; and a cable connector inserted into the connector insertion groove to guide the insertion of the cable, the cable connector preventing moisture from being introduced into the case.

In another embodiment, an electric vehicle charger includes: a case including a lower case having an opened top surface and in which a connector insertion groove is defined in a side surface thereof and an upper case having an opened bottom surface and covering the opened top surface of the lower case; a circuit board seated on the lower case and on which at least one electrical component of a short-circuit detection part detecting short-circuit of an electric vehicle, a detection part detecting overvoltage and overcurrent during charging of the electric vehicle, a communication module communicating with a charging control part of the electric vehicle, and a display part displaying a charged state of the electric vehicle is mounted; a cable inserted into the lower case, the cable being electrically connected to the circuit board; and a cable connector inserted into the connector insertion groove to guide the insertion of the cable, the cable connector preventing moisture from being introduced into the case, wherein the cable connector includes: a waterproof packing fitted into the cable through hole; a bracket fixed to the inside of the lower case in a state where the bracket covers a top surface of the waterproof packing; and a waterproof cover covering a rear surface of the waterproof packing, the waterproof cover being fixed to a side surface of the lower case.

The details of one or more embodiments are set forth in the accompanying drawings and the description below. Other features will be apparent from the description and drawings, and from the claims.

DETAILED DESCRIPTION OF THE EMBODIMENTS

In the following detailed description of the preferred embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Hereinafter, an electric vehicle charger according to embodiments will be described in detail with reference to the accompanying drawings.

Figure 1:
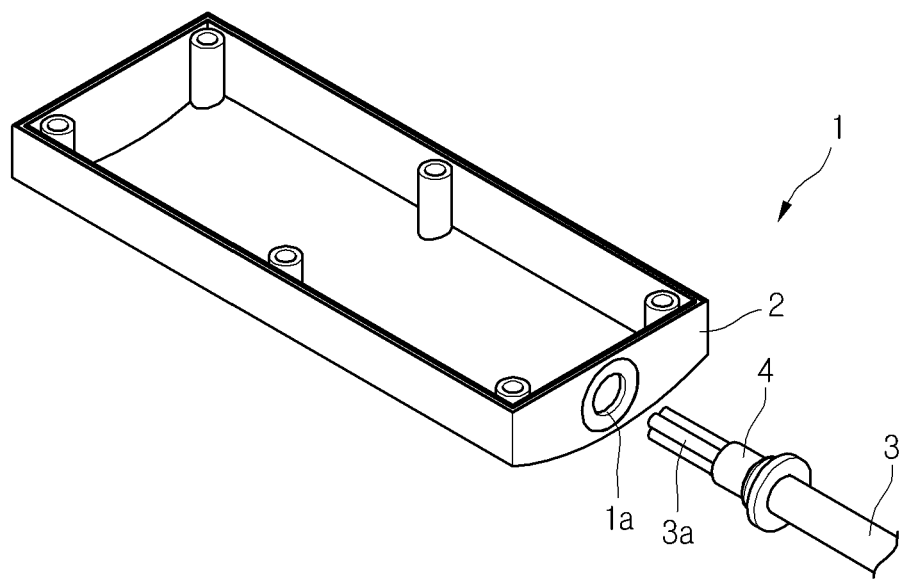
FIG. 1 is a perspective view illustrating a structure of a control box of a home charger.
Figure 2:
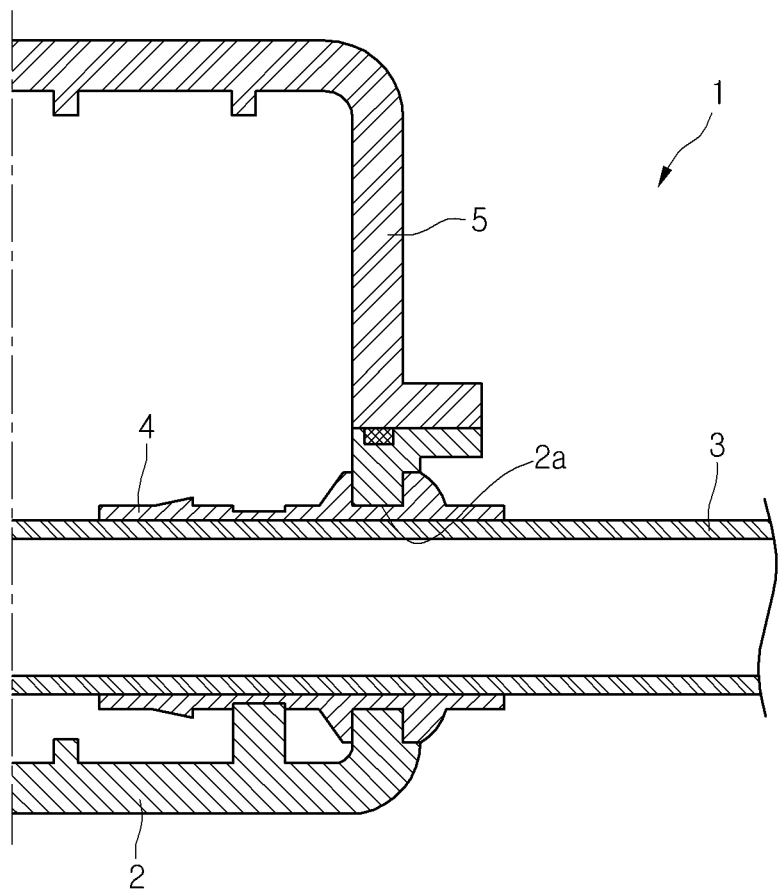
FIG. 2 is a cross-sectional view of a connection structure between the control box and a cable.
Figure 3:
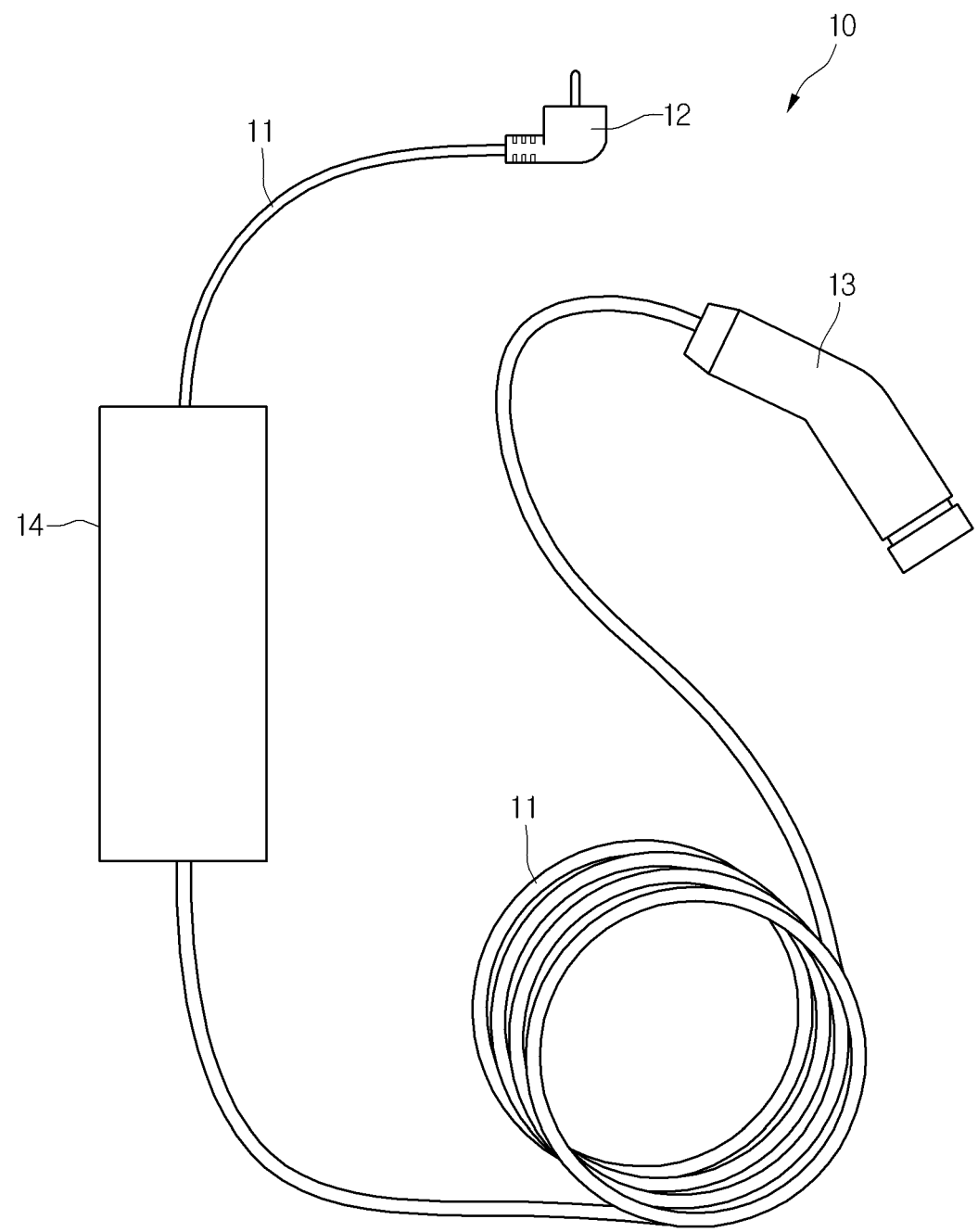
FIG. 3 is a perspective view of an electric vehicle charger according to an embodiment.

FIG. 3 is a perspective view of an electric vehicle charger according to an embodiment.

Referring to FIG. 3, an electric vehicle charger 10 according to an embodiment includes a home charger which is capable of charging electric vehicles by using a power source supplied into the inside of a building.

In detail, the charger 10 includes a power source-side plug 12 inserted into a power source socket disposed in the inside of the building, a control box 14 controlling the charging, a charging connector 13 connected to a vehicle, and a cable 11 connecting the power source-side plug 12, the control box 14, and the charging connector to each other. Also, a short-circuit detection circuit, a relay selectively blocking a current flow, an overvoltage and overcurrent detection part, a display part displaying a charged state, and a circuit board on which an electrical component including a communication module communicating with the electrical vehicles is mounted are disposed within the control box 14. Also, the control box 14 receives information for confirming whether charging of the electric vehicle is prepared and completed through the communication module. Also, a user may confirm whether the electric vehicle is charging, or whether the charging of the electric vehicle is stopped or completed through the display part. Also, whether overcurrent or overvoltage flows into the electric vehicle during the charging may be detected by the overvoltage and overcurrent detection part. As a result, the relay may operate to selectively block the power supply. In addition, when the short-circuit occurs within the vehicle during the charging, the power supply may be blocked by the short-circuit detection circuit.

To achieve the above-described function, a plurality of wires including an electric wire and signal wire are accommodated within the cable 11 and electrically connected to the electric vehicle through the charging connector 13.

The cable 13 has one end connected to the charging cable 13 and the other end connected to the circuit board by passing through the control box 14. Hereinafter, a structure for inserting the cable 11 into the control box 14 and a lateral waterproof structure of the control box 14 through which the cable passes will be described in detail with reference to the accompanying drawings.

Figure 4:
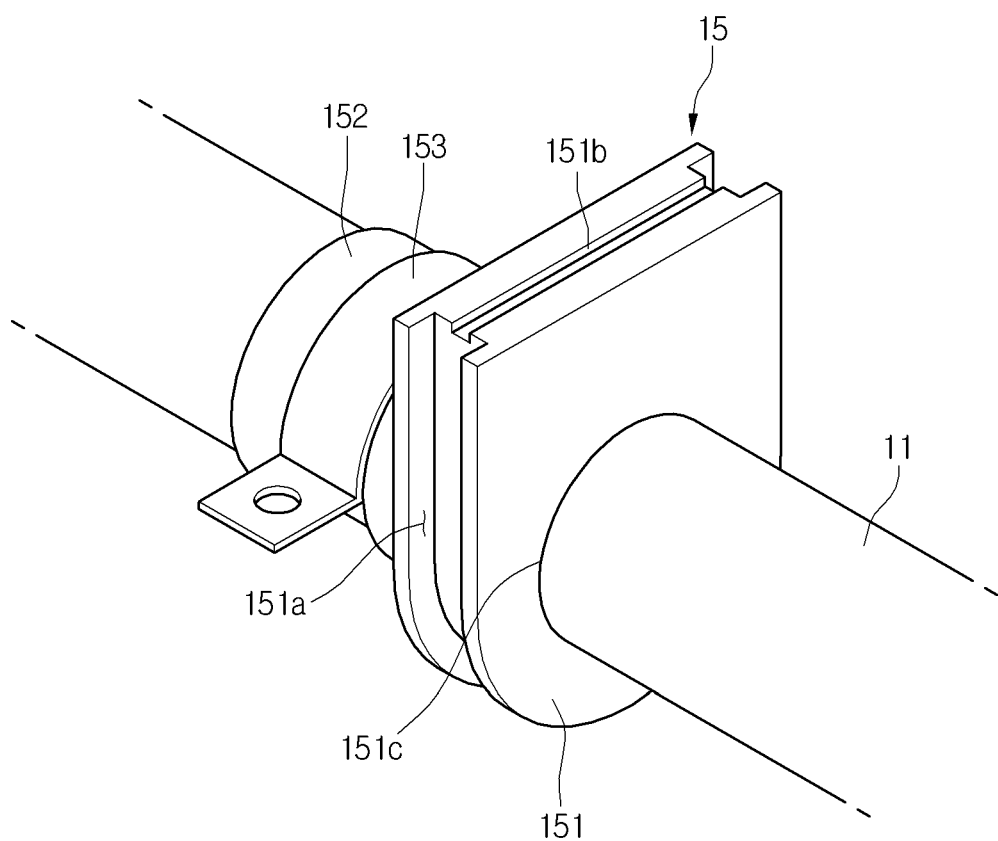
FIG. 4 is a perspective view illustrating a cable connection structure of the charger according to an embodiment.
Figure 5:
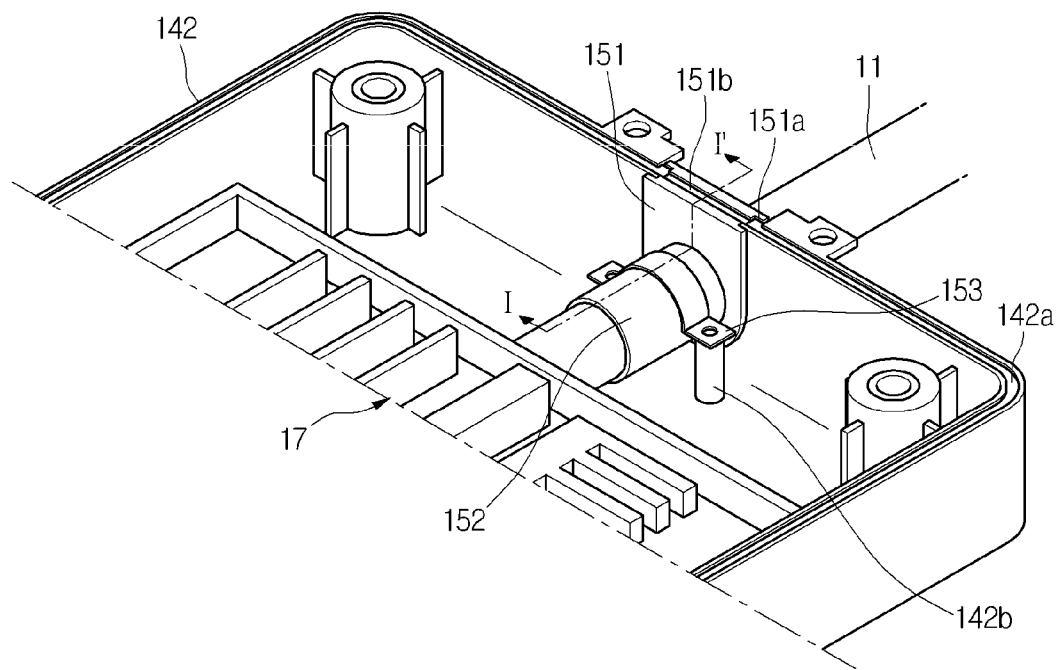
FIG. 5 is a partial perspective view of a state in which the cable connection structure is mounted on a lower case of a control box.
Figure 6:
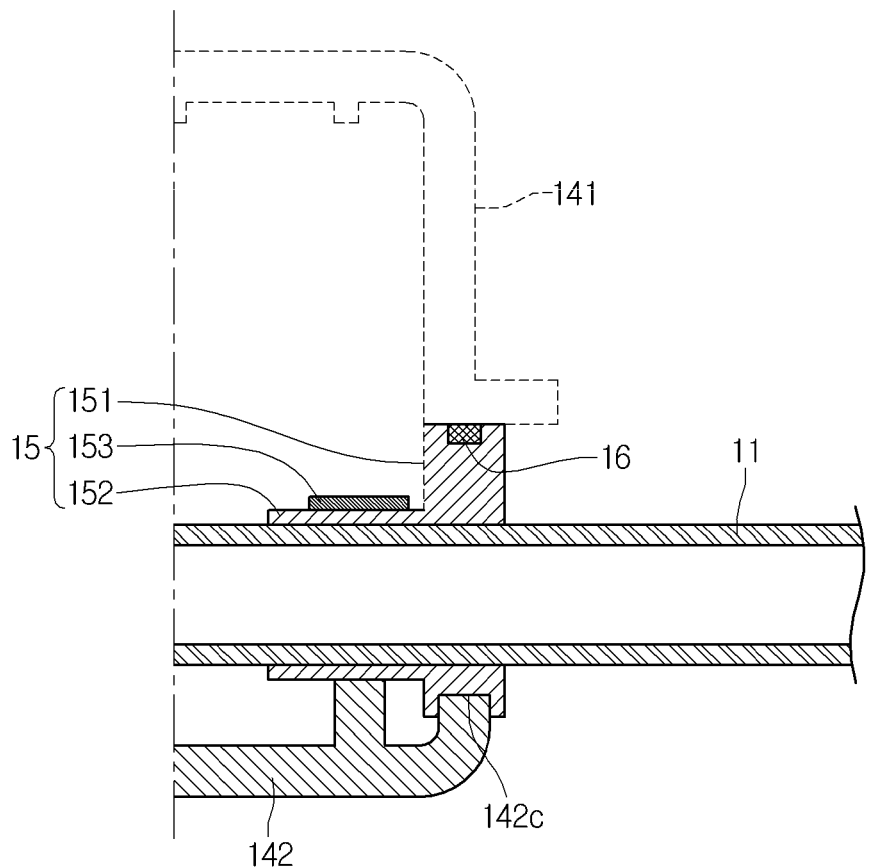
FIG. 6 is a longitudinal cross-sectional view taken along line I-I of FIG. 5.

FIG. 4 is a perspective view illustrating a cable connection structure of the charger according to an embodiment, FIG. 5 is a partial perspective view of a state in which the cable connection structure is mounted on a lower case of a control box, and FIG. 6 is a longitudinal cross-sectional view taken along line I-I of FIG. 5.

Referring to FIGS. 4 to 6, the cable connection structure according to an embodiment includes a cable connector 15 surrounding an outer circumferential surface of the cable 11, a control box 14 on which the cable connector 15 is mounted, and a circuit board 17 accommodated within the control box 14 and to which wires within the cable 11 are connected.

In detail, the control box 14 includes a lower case 142, on which the circuit board 17 is seated, on a bottom surface therein and an upper case 141 coupled to a top surface of the lower case 142. A connector insertion groove 142c in which the cable connector 15 is inserted is defined in a side surface of the lower case 142. Also, the connector insertion groove 142c may be recessed by a predetermined depth and width from the top surface of the lower case 142.

The cable connector 15 includes a connector body 151 slideably inserted into the connector insertion groove 142c, a guide sleeve 152 extending from a front surface of the connector body 151 by a predetermined length diameter, and a bracket 153 surrounding an upper surface of the guide sleeve 152 to support the guide sleeve 152.

In detail, the connector body 151 may have the same outer shape as that of the connector insertion groove 142c. In a state where the connector body 151 is completely inserted into the connector insertion groove 142c, a top surface of the connector body 151 may be substantially flush with that of the lower case 142. Also, a slide groove 151a is defined in each of side and bottom surfaces of the connector body 151. An edge of the connector insertion groove 142c is fitted into the slide groove 151a. That is, in the state where the edge of the connector insertion groove 142c is fitted into the slide groove 151a, the connector body 151 slideably moves downward to mount the connector body 151 in the connector insertion groove 152c. Also, sealing grooves 142a and 151b on which the sealing member 16 is seated are recessed from the top surfaces of the lower case 142 and the connector body 151, respectively.

The guide sleeve 152 extending from the front surface of the connector body 151 has the same inner diameter as an outer diameter of the cable 11. Also, the bracket 153 may be rounded to cover a half of an upper circumferential portion of the guide sleeve 152. A coupling hole is defined in each of both ends of the bracket 153. Both ends of the bracket 153 are seated on a coupling boss 142b protruding from a bottom surface of the lower case 142. Also, since a coupling member passes through the coupling hole and is inserted into the coupling boss 142b, the guide sleeve 152 is fixed to the inside of the lower case 142. Of cause, a support structure supporting a half of a lower circumferential portion of the guide sleeve 152 may be provided on the bottom surface of the lower case 142.

Due to the cable connection structure including the above-described components, the electric vehicle charger may be assembled through follow processes.

First, the cable 11 is inserted into the cable connector 15 to allow an end of the cable 11 to pass through the guide sleeve 152. Next, the connector body 151 descends from the top surface of the lower case 142 to fit the edge of the connector insertion groove 142c into the guide groove 151a. In this state, the connector body 151 slideably moves downward to completely fit the connector body 151 into the connector insertion groove 142c. Then, the bracket 153 is fixed to the coupling boss 142b of the lower case 142 by using the coupling member. The cable 11 is connected to the circuit board 17, and then the upper case 141 is mounted and fixed to the lower case 142 by using the coupling member. Here, the sealing member 16 is inserted first into the sealing groove 142a defined in the top surface of the lower case 142, and then the upper case 141 is mounted and fixed to the lower case 142.

The connector cable 15 may be a plastic injection-molded material. Also, the sealing member may be disposed between a side surface of the connector body 151 and the connector insertion groove 142c to sufficiently secure a waterproof function.

Figure 7:
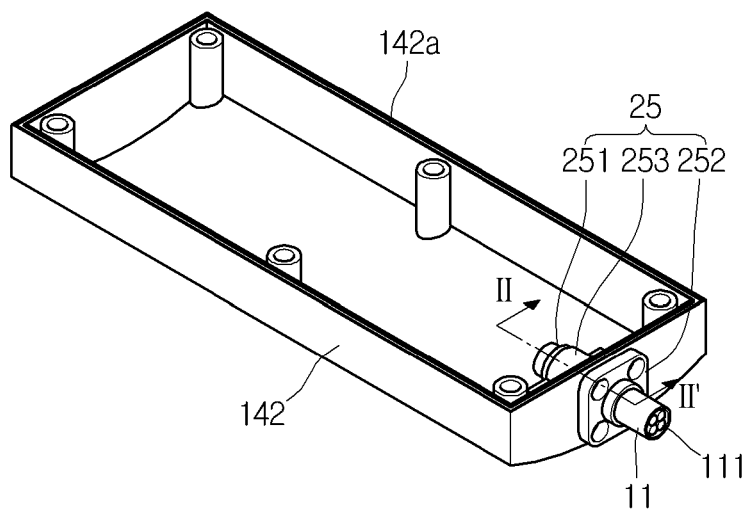
FIG. 7 is a perspective view of a cable connection structure according to another embodiment.
Figure 8:
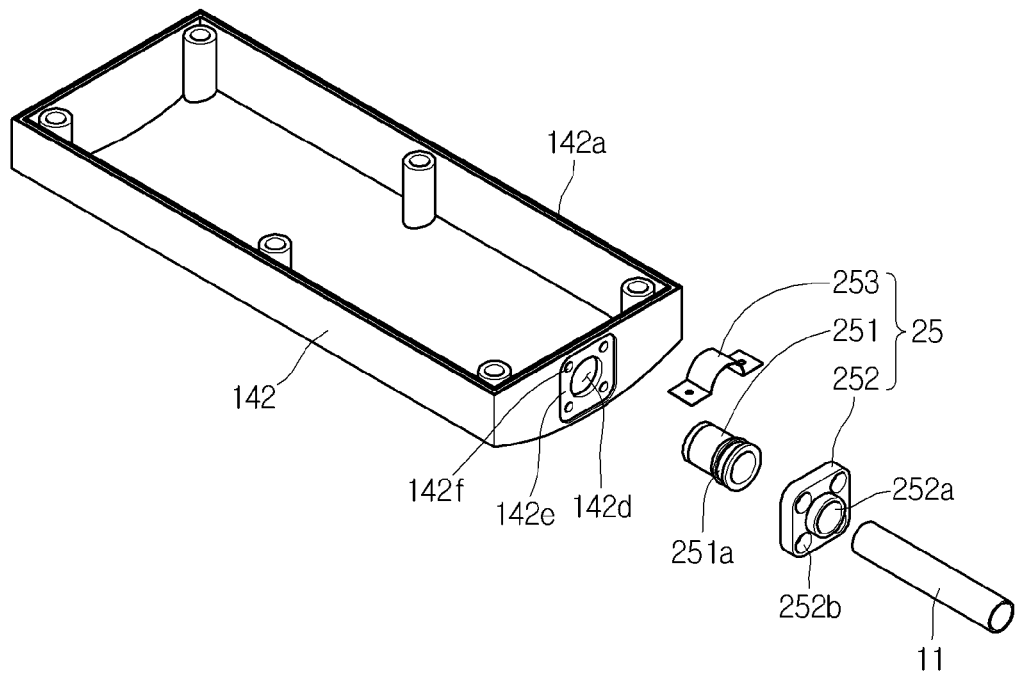
FIG. 8 is an exploded perspective view of the cable connection structure according to another embodiment.
Figure 9:
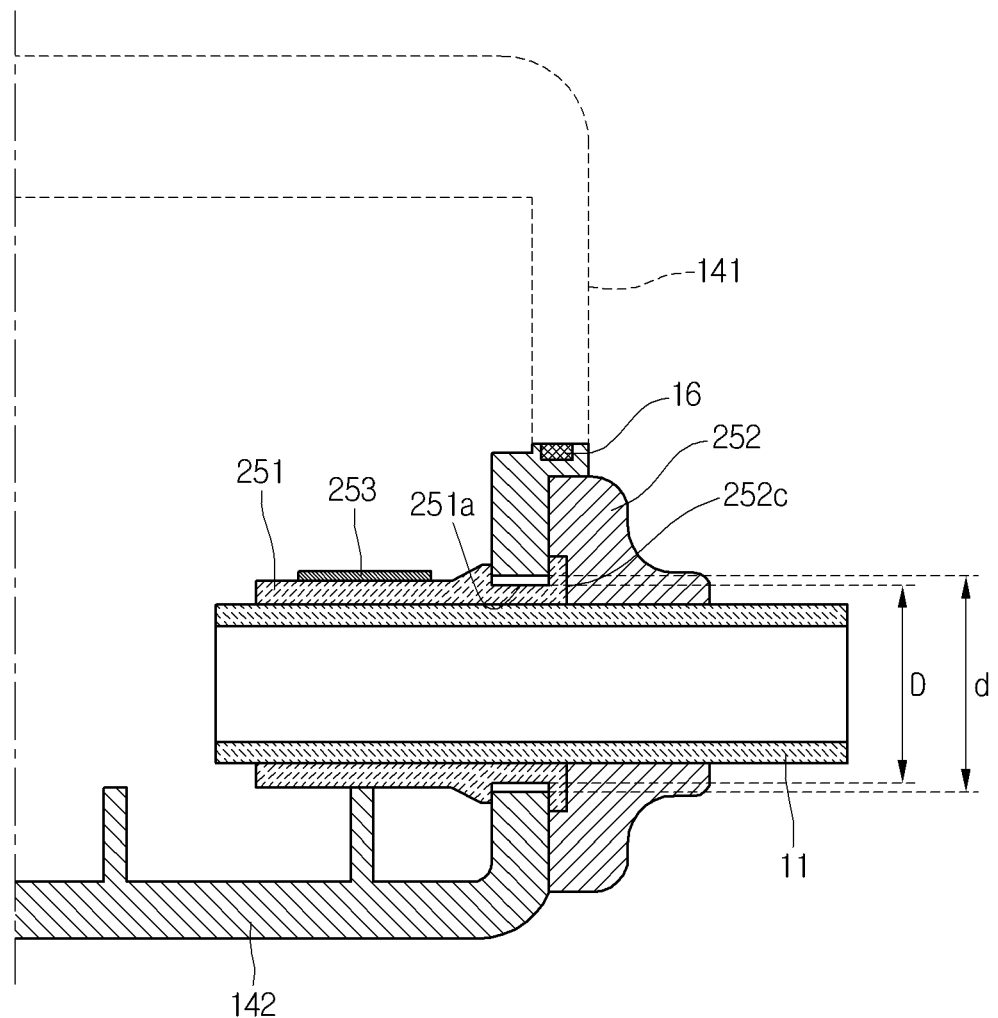
FIG. 9 is a cross-sectional view taken along line II-II of FIG. 7.

FIG. 7 is a perspective view of a cable connection structure according to another embodiment, FIG. 8 is an exploded perspective view of the cable connection structure according to another embodiment, and FIG. 9 is a cross-sectional view taken along line II-II of FIG. 7.

Referring to FIGS. 7 to 9, a cable connection structure according to another embodiment includes a lower case 142 in which a cable through hole 142d is defined in a side surface thereof, and a sealing groove 142a is defined in a top surface thereof, a cable connector 25 inserted into the cable through hole 142d, and a cable 11 passing through the cable connector 25 and inserted into the lower case 142. As described above, a plurality of wires including an electric wire and signal wire may be accommodated within the cable 11.

In detail, the cable connector 25 includes a waterproof packing 251 through which the cable 11 passes, a waterproof cover 252 closely attached to a rear surface of the waterproof packing 251, and a bracket 253 pushing a top surface of the waterproof packing 251 to fix the waterproof packing 251 in a state where the cable connector 25 is mounted on the lower case 142.

A waterproof cover seat groove 142e on which the waterproof cover 252 is seated is defined in one surface of the lower case 142, particularly, a surface in which the cable through hole 142d is defined. Also, the cable through hole 142d is defined in a central portion of the waterproof cover seat groove 142e. Also, a sealing groove 251a is defined in an outer circumferential surface of the waterproof packing 251. An edge of the cable through hole 142d is fitted into the sealing groove 251a to secure a waterproof function. Also, a coupling hole 252b is defined in each of four edges of the waterproof cover 252, and a coupling hole 142f is defined in the waterproof cover seat groove 142e. A stepped portion 252c on which the rear surface of the waterproof packing 251 is seated is recessed from a front surface of the waterproof cover 252.

In an assembly process of the cable connection structure according to the current embodiment, the waterproof packing 251 fitted into the outer circumferential surface of the cable 11 is inserted into the cable through hole 142d. In this state, the waterproof cover 25 is fitted into the outer circumferential surface of the cable 11 to closely attach the rear surface of the waterproof packing 251 to the stepped portion 252c. Then, the coupling member is inserted into the coupling holes 252b and 142f to fix the waterproof cover 252 to the lower case 142. Thereafter, the bracket 253 is mounted on a top surface of the waterproof packing 251 so that the bracket 253 is fixed to the lower case 142 by using the coupling member. The bracket 253 may be assembled through the same process as that of the foregoing embodiment.

Here, the double waterproof function may be secured by the waterproof packing 251 and the waterproof cover 252. Thus, when compared to the related art, the cable through hole 142d defined in the lower case 142 may have an inner diameter d relatively greater than an outer diameter D of the sealing groove 251a defined in the waterproof packing 251. Thus, since the outer diameter of the waterproof packing 152, particularly, the outer diameter D of the sealing groove 251a is maintained as it is, and the inner diameter d of the cable through hole 142d increases, the waterproof packing 251 may be more easily coupled to the lower case 142.

In detail, even though the waterproof packing 251 is slightly loosely coupled to the cable through hole 142d, since the waterproof cover 252 is strongly closely attached to the rear surface of the waterproof packing 251, it may sufficiently prevent moisture from being introduced through a gap defined between the waterproof packing 251 and the cable through hole 142d.

Also, since the above-described waterproof packing 251 may be formed of a soft material such as rubber, the waterproof cover 252 may be formed of a plastic injection-molded material.

According to the electric vehicle charger according to the embodiments, the assembly process of the cable may be simplified and improved without deteriorating the waterproof performance.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric vehicle charger comprising:
 a case comprising:
  a lower case portion having a top opening and comprising a connector insertion groove at a side surface; and
  an upper case portion having a bottom opening and configured to cover the top opening of the lower case;
 a circuit board seated on the lower case and on which at least one electrical component of a short-circuit detection part detecting short-circuit of an electric vehicle is positioned, the at least one electrical component including a detection part configured to detect overvoltage and overcurrent during charging of the electric vehicle, a communication module configured to communicate with a charging control part of the electric vehicle, and a display part configured to display a charged state of the electric vehicle;
 a cable inserted into the lower case portion and electrically connected to the circuit board; and a cable connector inserted into the connector insertion groove to position the inserted cable and configured to prevent moisture from being introduced into the case, the cable connector comprising:
- a connector body configured to be slidably inserted into the connector insertion groove;
- a guide sleeve through which the cable passes and extending from a surface of the connector body; and
- a bracket configured to surround an outer surface of the guide sleeve to fix the guide sleeve, wherein first and second coupling openings are respectively defined at a first side and a second side of the bracket and the first and second sides of the bracket are seated on at least one coupling boss protruding from the lower case portion, wherein the first and second sides of the bracket are secured to the at least one coupling boss by at least one coupling member which passes through the first and second coupling openings and is inserted into the at least one coupling boss, and wherein the guide sleeve is fixed to the inside of the lower case.

2. The electric vehicle charger according to claim 1, wherein:
the connector insertion groove is recessed downward from an edge of the top opening of the lower case portion by a predetermined depth, and
a top side of the connector body is flush with the edge of the top opening of the lower case portion when the connector body is fully inserted into the connector insertion groove.

3. The electric vehicle charger according to claim 2, further comprising a sealing member positioned at an edge of the top opening of the lower case and the top side of the connector body,
wherein an edge of the bottom opening of the upper case is attached to the edge of the top opening of the lower case and the top side of the connector body.

4. An electric vehicle charger comprising:
a case comprising:
- a lower case portion having a top opening and comprising a connector insertion groove at a side surface; and
- an upper case portion having a bottom opening and configured to cover the top opening of the lower case;

a circuit board seated on the lower case and on which at least one electrical component of a short-circuit detection part detecting short-circuit of an electric vehicle is positioned, the at least one electrical component including a detection part configured to detect overvoltage and overcurrent during charging of the electric vehicle, a communication module configured to communicate with a charging control part of the electric vehicle, and a display part configured to display a charged state of the electric vehicle;

a cable inserted into the lower case portion and electrically connected to the circuit board; and a cable connector inserted into the connector insertion groove to position the inserted cable and configured to prevent moisture from being introduced into the case,
wherein the cable connector comprises:
- a waterproof packing positioned in a hole through which the inserted cable passes;
- a bracket fixed to the inside of the lower case portion and covering a top surface of the waterproof packing; and
- a waterproof cover covering a rear surface of the waterproof packing and fixed to a side surface of the lower case.

5. The electric vehicle charger according to claim 4, wherein the waterproof cover comprises a stepped portion on which the rear surface of the waterproof packing is seated.

6. The electric vehicle charger according to claim 4, further comprising a seat groove at a side of the lower case, wherein the waterproof cover is seated on the seat groove and the hole through which the inserted cable passes is centered at the seat groove.

7. The electric vehicle charger according to claim 4, further comprising a sealing member seated at an edge of the top opening of the lower case.

* * * * *